US009530772B1

(12) United States Patent
Balakrishnan et al.

(10) Patent No.: US 9,530,772 B1
(45) Date of Patent: Dec. 27, 2016

(54) METHODS OF MANUFACTURING DEVICES INCLUDING GATES WITH MULTIPLE LENGTHS

(71) Applicant: International Business Machines Corporation, Armonk, NY (US)

(72) Inventors: Karthik Balakrishnan, White Plains, NY (US); Kangguo Cheng, Schenectady, NY (US); Pouya Hashemi, White Plains, NY (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/820,126

(22) Filed: Aug. 6, 2015

(51) Int. Cl.
| | |
|---|---|
| *H01L 27/06* | (2006.01) |
| *H01L 49/02* | (2006.01) |
| *H01L 29/78* | (2006.01) |
| *H01L 29/66* | (2006.01) |
| *H01L 21/3213* | (2006.01) |
| *H01L 21/02* | (2006.01) |
| *H01L 21/8234* | (2006.01) |

(52) U.S. Cl.
CPC ..... *H01L 27/0629* (2013.01); *H01L 21/02532* (2013.01); *H01L 21/02592* (2013.01); *H01L 21/32137* (2013.01); *H01L 21/823437* (2013.01); *H01L 28/20* (2013.01); *H01L 29/6656* (2013.01); *H01L 29/66545* (2013.01); *H01L 29/78* (2013.01)

(58) Field of Classification Search
CPC ............... H01L 27/06; H01L 29/66545; H01L 21/823842; H01L 27/0629
See application file for complete search history.

(56) References Cited

U.S. PATENT DOCUMENTS

| | | | |
|---|---|---|---|
| 6,998,332 B2 | 2/2006 | Furukawa et al. | |
| 7,470,570 B2 | 12/2008 | Beintner et al. | |
| 8,951,868 B1 | 2/2015 | Jain | |
| 9,006,107 B2 | 4/2015 | Wang et al. | |
| 9,006,110 B1 | 4/2015 | Sun et al. | |
| 2009/0206416 A1* | 8/2009 | Cheng ............. | H01L 21/823842 257/369 |
| 2010/0248481 A1 | 9/2010 | Schultz | |
| 2010/0311231 A1* | 12/2010 | Thei ................ | H01L 21/823842 438/587 |
| 2013/0075827 A1* | 3/2013 | Lee .................... | H01L 29/4966 257/369 |

(Continued)

*Primary Examiner* — Phuc Dang
(74) *Attorney, Agent, or Firm* — Louis J. Percello; Ryan, Mason & Lewis, LLP

(57) ABSTRACT

A method for manufacturing a semiconductor device comprises forming a first dummy gate layer on a substrate, forming a second dummy gate layer on the substrate adjacent the first dummy gate layer, wherein the second dummy gate layer comprises a material which is capable of being selectively etched with respect a material of the first dummy gate layer, and patterning each of the first and second dummy gate layers into a plurality of first dummy gate stacks and a plurality of second dummy gate stacks, respectively, wherein the first dummy gate stacks are each wider along a gate length direction than each of the second dummy gate stacks, wherein the patterning is performed using a reactive ion etch (RIE) process that results in different lateral trimming between the first and second dummy gate layers.

16 Claims, 8 Drawing Sheets

(56) References Cited

U.S. PATENT DOCUMENTS

2014/0024209 A1   1/2014   Jung et al.
2014/0070414 A1   3/2014   Hartig et al.
2014/0329380 A1   11/2014  Cheng et al.
2014/0329388 A1   11/2014  Jang et al.
2016/0043079 A1* 2/2016   Chang ................ H01L 27/0886
                                                    257/401

* cited by examiner

METHODS OF MANUFACTURING DEVICES INCLUDING GATES WITH MULTIPLE LENGTHS

TECHNICAL FIELD

The field generally relates to semiconductor devices including gates with multiple lengths and methods of manufacturing same and, in particular, to multiple gate length devices formed using a single sidewall imaging transfer process.

BACKGROUND

Lower and more aggressive gate pitch scaling, for example, beyond the 14 nm node, calls for sidewall imaging transfer (SIT) to form gates because a sub-80 nm pitch typically cannot be formed reliably by a single path of conventional lithography.

Conventional SIT processes, where only one critical dimension can be achieved, result in all gates having the same length, which contradicts multiple length (multiple-L) gate requirements in various complementary metal oxide semiconductor (CMOS) devices. Having different gate lengths in CMOS devices can be an important feature with various applications, such as achieving multiple threshold voltages.

Using multiple SIT paths to form multiple-L gates adds processing cost and complexity, as it is not trivial to perform patterning with thin and high aspect ratio SIT spacers. Therefore, there is a need for an improved process for forming multiple-L gates.

SUMMARY

According to an exemplary embodiment of the present invention, a method for manufacturing a semiconductor device comprises forming a first dummy gate layer on a substrate, forming a second dummy gate layer on the substrate adjacent the first dummy gate layer, wherein the second dummy gate layer comprises a material which is capable of being selectively etched with respect a material of the first dummy gate layer, patterning each of the first and second dummy gate layers into a plurality of first dummy gate stacks and a plurality of second dummy gate stacks, respectively, wherein the first dummy gate stacks are each wider along a gate length direction than each of the second dummy gate stacks, and replacing the first dummy gate stacks and the second dummy gate stacks with metal to form a plurality of first gate electrodes and a plurality of second gate electrodes respectively corresponding the first dummy gate stacks and the second dummy gate stacks, wherein the first gate electrodes each have a larger gate length than a gate length of each of the second gate electrodes.

According to an exemplary embodiment of the present invention, a method for manufacturing a semiconductor device, comprises forming a first dummy gate layer on a substrate, forming a second dummy gate layer on the substrate adjacent the first dummy gate layer, wherein the second dummy gate layer comprises a material which is capable of being selectively etched with respect a material of the first dummy gate layer, and patterning each of the first and second dummy gate layers into a plurality of first dummy gate stacks and a plurality of second dummy gate stacks, respectively, wherein the first dummy gate stacks are each wider along a gate length direction than each of the second dummy gate stacks, wherein the patterning is performed using a reactive ion etch (RIE) process that results in different lateral trimming between the first and second dummy gate layers, and wherein the first dummy gate layer comprises amorphous silicon (a-Si) and the second dummy gate layer comprises amorphous silicon germanium (a-SiGe).

According to an exemplary embodiment of the present invention, a semiconductor device comprises an integrated circuit having at least two transistors with different gate lengths from each other, a silicon resistor, and a silicon germanium resistor, wherein the silicon and silicon germanium resistors have different resistivities from each other.

These and other exemplary embodiments of the invention will be described in or become apparent from the following detailed description of exemplary embodiments, which is to be read in connection with the accompanying drawings.

BRIEF DESCRIPTION OF THE DRAWINGS

Exemplary embodiments of the present invention will be described below in more detail, with reference to the accompanying drawings, of which.

DETAILED DESCRIPTION OF EXEMPLARY EMBODIMENTS

Figure 1:
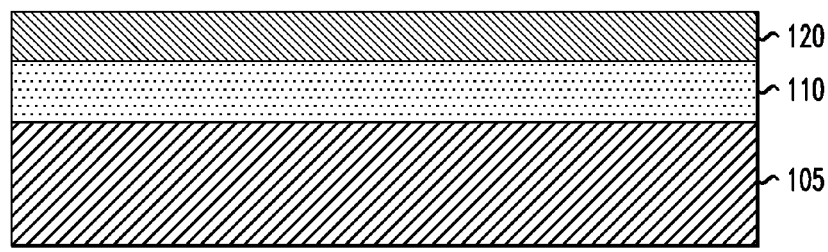
FIG. 1 is a cross-sectional view of a semiconductor substrate including isolation and channel regions, according to an exemplary embodiment of the present invention.

Exemplary embodiments of the invention will now be discussed in further detail with regard to semiconductor devices including gates with multiple lengths and methods of manufacturing same and, in particular, to multiple gate length devices formed using a single sidewall imaging transfer process. This invention may, however, be embodied in many different forms and should not be construed as limited to the embodiments set forth herein.

The embodiments of the present invention include a semiconductor device including multiple-L gates, and methods for manufacturing a semiconductor device including multiple-L gates on the same chip by a single SIT process.

Silicon germanium (SiGe) and silicon (Si) can be both etched using a reactive ion etch (RIE) process, but the resulting critical dimension (CD) (e.g., size in a gate length direction) is typically smaller after RIE on the SiGe compared to Si.

Embodiments of the present invention use both amorphous Si (a-Si) and amorphous SiGe (a-SiGe) as dummy gates during a single SIT process to achieve devices with multiple gate lengths on the same chip. The a-Si results in devices with longer gate lengths and the a-SiGe results in devices with smaller gate lengths. With the same or similar lithography, hard mask (HM) and RIE processes, multiple gate lengths can be achieved on the same chip incorporating an aggressively scaled contacted gate pitch.

It is to be understood that the various layers and/or regions shown in the accompanying drawings are not drawn to scale, and that one or more layers and/or regions of a type commonly used in fin field-effect transistor (FinFET), CMOS and/or other semiconductor devices may not be explicitly shown in a given drawing. This does not imply that the layers and/or regions not explicitly shown are omitted from the actual devices. In addition, certain elements may be left out of particular views for the sake of clarity and/or simplicity when explanations are not necessarily focused on the omitted elements. Moreover, the same or similar reference numbers used throughout the drawings are used to denote the same or similar features, elements, or structures, and thus, a detailed explanation of the same or similar features, elements, or structures will not be repeated for each of the drawings.

The multiple gate length devices and methods for forming same in accordance with embodiments of the present invention can be employed in applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, functional circuitry, etc. Systems and hardware incorporating the multiple gate length devices are contemplated embodiments of the invention. Given the teachings of embodiments of the invention provided herein, one of ordinary skill in the art will be able to contemplate other implementations and applications of embodiments of the invention.

The embodiments of the present invention can be used in connection with semiconductor devices that may require transistor gates having multiple lengths and/or resistors having different resistivities. By way of non-limiting example, the semiconductor devices can include, but are not limited to, CMOS devices, MOSFET devices, FinFET devices, and/or semiconductor devices that do not use FinFET technology.

As used herein, "length," "gate length," or "L gate" refers to the dimension taken along a left to right direction of a gate structure in the cross-sectional views referred to herein. Note, for example, FIGS. 9-12, 13A, 13B and 14, showing relatively narrow and wide gate structures in a left to right direction.

FIG. 1 is a cross-sectional view of a semiconductor substrate 105 including isolation and semiconductor regions 110, 120 thereon, according to an exemplary embodiment of the present invention. The substrate 105 may comprise semiconductor material including, but not limited to, Si, SiGe, SiC, SiGeC, III-V, II-V compound semiconductor or other like semiconductor. In addition, multiple layers of the semiconductor materials can be used as the semiconductor material of the substrate.

Referring to FIG. 1, the semiconductor substrate 105, can be, for example, a silicon-on-insulator (SOI) substrate, where the isolation region 110 comprises a buried insulating layer, such as, for example, a buried oxide or nitride layer, located on an upper surface of the semiconductor substrate 105. A semiconductor region 120 may include fully depleted (FD) or partially depleted (PD) SOI, or fins. The SOI layer may comprise semiconductor material including, but not limited to, Si, SiGe, SiC, SiGeC, III-V, II-V compound semiconductor or other like semiconductor. In addition, multiple layers of the semiconductor materials can be used as the semiconductor material of the SOI layer. A bulk substrate may also be used as the semiconductor substrate.

Figure 2:
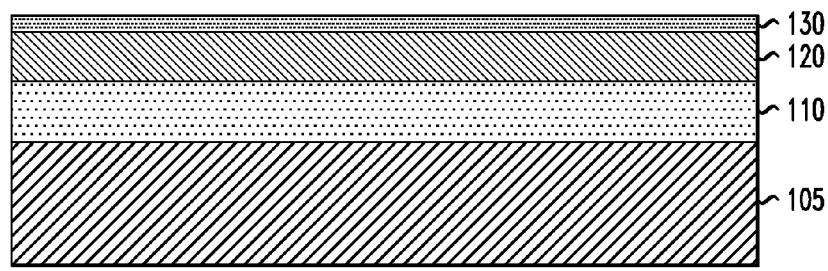
FIG. 2 is a cross-sectional view illustrating formation of a dummy dielectric layer in a method of manufacturing a semiconductor device, according to an embodiment of the present invention.

FIG. 2 is a cross-sectional view illustrating formation of a dummy dielectric layer in a method of manufacturing a semiconductor device, according to an embodiment of the present invention. Referring to FIG. 2, a dummy dielectric layer 130, comprising, for example, silicon dioxide (Sift), a high-K dielectric, or other dielectric, can be deposited using, for example, any suitable deposition technique known in the art, including, but not limited to, chemical vapor deposition (CVD), plasma enhanced CVD (PECVD), physical vapor deposition (PVD), atomic layer deposition (ALD), molecular beam deposition (MBD), pulsed laser deposition (PLD), and/or liquid source misted chemical deposition (LSMCD).

Figure 3:
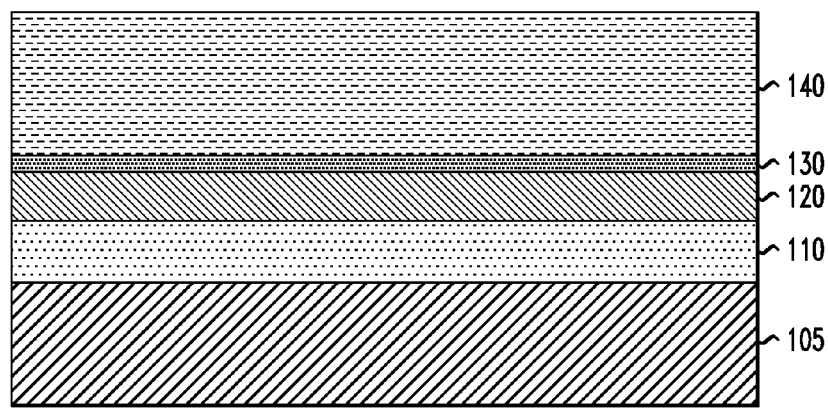
FIG. 3 is a cross-sectional view illustrating formation of a first dummy gate layer in a method of manufacturing a semiconductor device, according to an exemplary embodiment of the invention.

FIG. 3 is a cross-sectional view illustrating formation of a first dummy gate layer in a method of manufacturing a semiconductor device, according to an exemplary embodiment of the invention. Referring to FIG. 3, a first dummy gate layer 140, comprising, for example, amorphous silicon (a-Si) is deposited using, for example, any suitable deposition technique known in the art, including, but not limited to, CVD, PECVD, PVD, ALD, MBD, PLD, and/or liquid LSMCD, and then planarized by an appropriate planarization process, such as, for example, chemical mechanical planarization (CMP).

Figure 4:
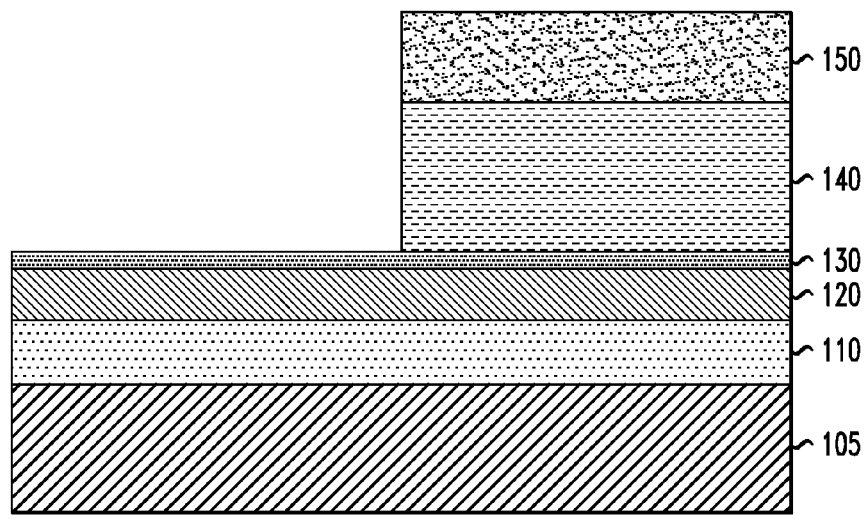
FIG. 4 is a cross-sectional view illustrating patterning of a first dummy gate layer in a method of manufacturing a semiconductor device, according to an exemplary embodiment of the invention.

FIG. 4 is a cross-sectional view illustrating patterning of a first dummy gate layer in a method of manufacturing a semiconductor device, according to an exemplary embodiment of the invention. Referring to FIG. 4, a mask 150 is deposited over a portion of first dummy gate layer 140, and the exposed portion of the first dummy gate layer 140 is removed down to the dummy dielectric layer 130 using, for example, an RIE process, wherein the etchant comprises, for example, chlorine. As described in more detail herein, the remaining portion of the first dummy gate layer 140, which comprises a-Si, corresponds to a region with larger gate lengths, and the region where the first dummy gate layer 140 was removed corresponds to smaller gate lengths. The mask 150 can be a hard mask, and comprise, for example, silicon nitride (SiN), or other material, such as, for example, silicon oxide, and is deposited using, for example CVD.

Figure 5:
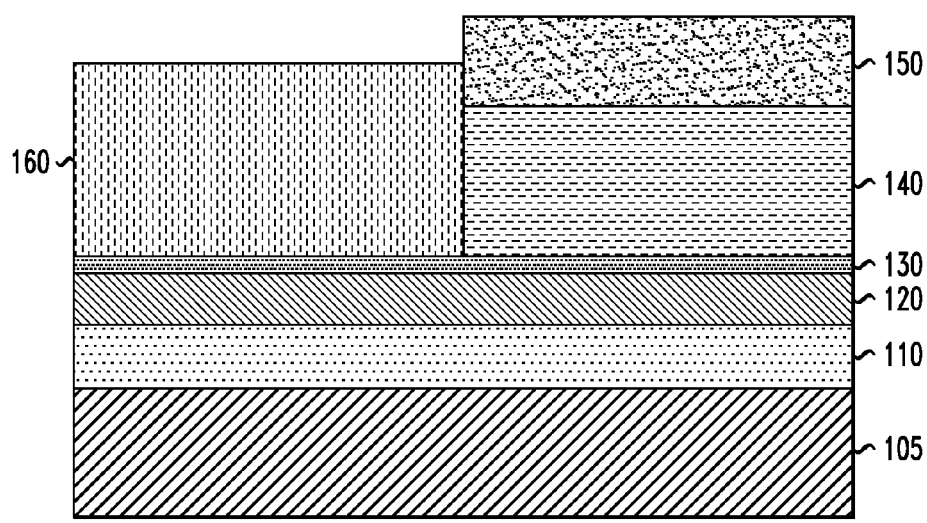
FIG. 5 is a cross-sectional view illustrating formation of a second dummy gate layer in a method of manufacturing a semiconductor device, according to an exemplary embodiment of the invention.

FIG. 5 is a cross-sectional view illustrating formation of a second dummy gate layer in a method of manufacturing a semiconductor device, according to an exemplary embodiment of the invention. Referring to FIG. 5, the second dummy gate layer 160, comprising, for example, amorphous silicon germanium (a-SiGe) is deposited on the exposed portion of the dummy dielectric layer 130 adjacent the first dummy gate layer 140 using, for example, any suitable deposition technique known in the art, including, but not limited to, CVD, PECVD, PVD, ALD, MBD, PLD, and/or liquid LSMCD. In some embodiments, a-Si and/or a-SiGe are intentionally doped with dopants such as boron, indium, phosphorus, arsenic, etc. The dopant concentration ranges from $1e18/cm^3$ to $1e21/cm^3$. In other embodiments, the dopant concentration in a-Si/a-SiGe is less than $1e18/cm^3$. In some embodiments, the germanium concentration (atomic concentration) in a-SiGe ranges from 15% to 95%. In some embodiments, the germanium concentration (atomic concentration) in a-SiGe ranges from 25% to 60%.

Figure 6:
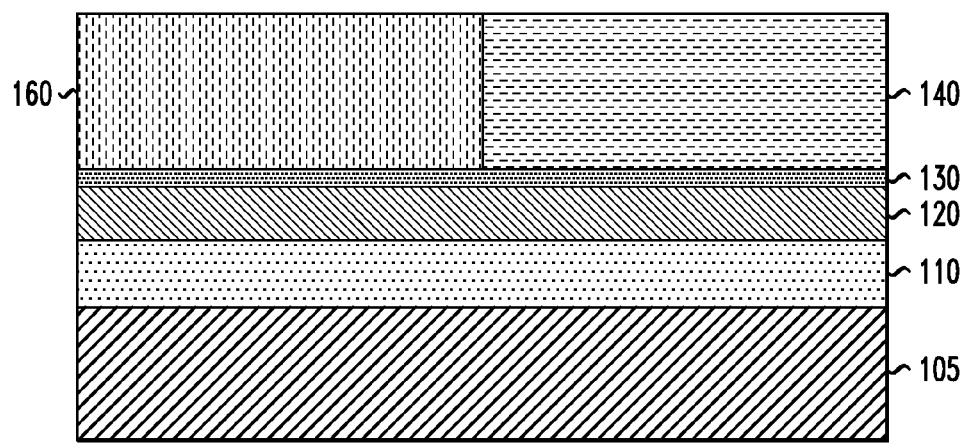
FIG. 6 is a cross-sectional view illustrating removal of a mask and planarization of the first and second dummy gate layers, according to an exemplary embodiment of the invention.

FIG. 6 is a cross-sectional view illustrating removal of the mask 150 and planarization of the first and second dummy gate layers 140, 160, according to an exemplary embodiment of the invention. Referring to FIG. 6, the mask 150 is removed using, for example, an appropriate stripping process, such as, for example, a selective etch process, such as, for example, using hot phosphoric acid to strip a silicon nitride hard mask. The first and second dummy gate layers 140, 160 are planarized using an appropriate planarization process, such as, for example, chemical mechanical planarization (CMP). According to an embodiment, the mask 150 can also be removed during the planarization process.

Figure 7:
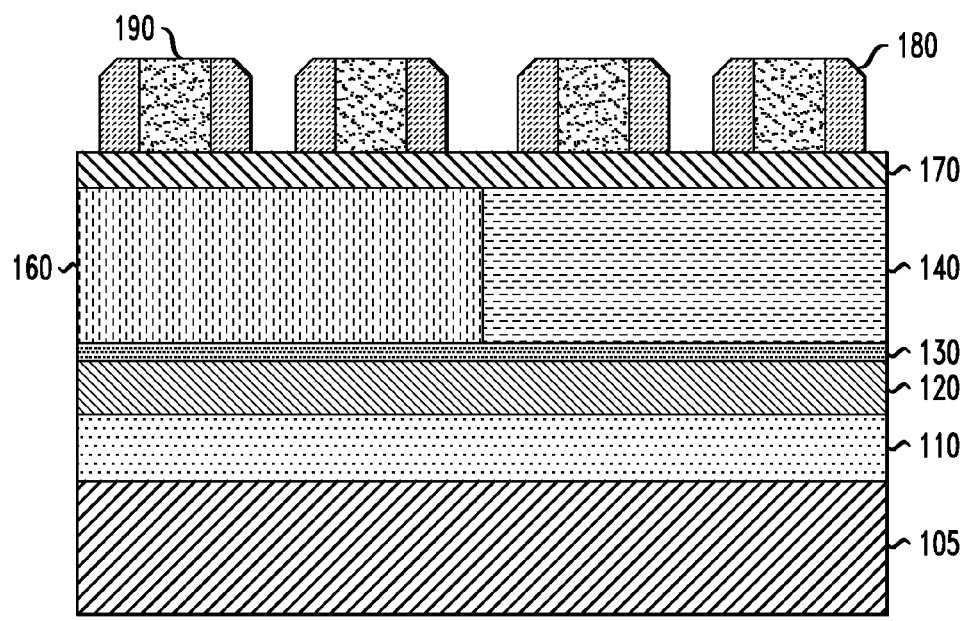
FIG. 7 is a cross-sectional view illustrating formation of a cap layer, mandrels and SIT spacers in a method of manufacturing a semiconductor device, according to an exemplary embodiment of the invention.

FIG. 7 is a cross-sectional view illustrating formation of a cap layer 170, mandrels 190 and SIT spacers 180 in a method of manufacturing a semiconductor device, according to an exemplary embodiment of the invention. Referring to FIG. 7, a part of a SIT process, a cap layer 170 comprising, for example, SiN, silicon oxide, or combination of multiple materials such as silicon nitride and silicon oxide, is deposited on the planarized first and second dummy gate layers 140, 160 using, for example, any suitable deposition technique known in the art, including, but not limited to, CVD, PECVD, PVD, ALD, MBD, PLD, and/or liquid LSMCD.

SIT spacers 180, comprising for example, an oxide, such as, silicon oxide, or another material such as, for example, SiN, SiBCN, are formed on the cap layer 170. The mandrels 190, comprising, for example, amorphous carbon, and/or polymers, are also formed on the cap layer 170 between the certain SIT spacers 180 as shown. The SIT spacers 180 and mandrels 190 are formed by first depositing the mandrel material on top of the cap layer 170, patterning the mandrel material into patterns, depositing spacer material and then performing spacer RIE. In accordance with an embodiment of the present invention, the SIT spacers 180 and the mandrels 190 therebetween are formed to have a vertical height in the cross-sectional view as shown, which is taller than a vertical height of the cap layer 170. By way of non-limiting example, the SIT spacers 180 can have a height which is 5 times that of the cap layer 170. For example, the cap layer 170 can have a height of 20 nm, while the SIT spacers 180 have a height of 100 nm.

Figure 8:
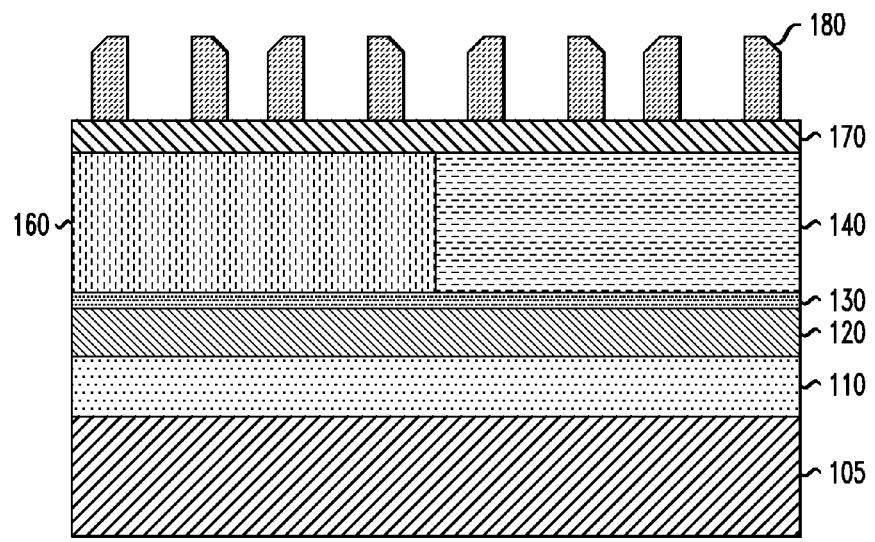
FIG. 8 is a cross-sectional view illustrating removal of mandrels in a method of manufacturing a semiconductor device, according to an exemplary embodiment of the invention.

FIG. 8 is a cross-sectional view illustrating removal of mandrels 190 in a method of manufacturing a semiconductor device, according to an exemplary embodiment of the invention. Referring to FIG. 8, the mandrels 190 are removed from between the certain SIT spacers 180 as shown to expose portions of the cap layer 170 that were under the mandrels 190. The mandrels 190 are removed using, for example, an ashing process containing oxygen plasma to strip amorphous carbon or poly mandrel materials.

Figure 9:
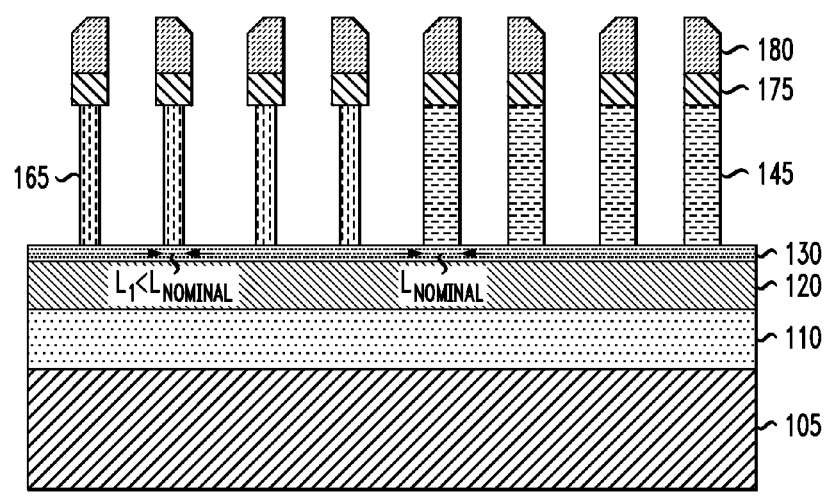
FIG. 9 is a cross-sectional view illustrating removal of exposed portions of the cap layer, and patterning of the first and second dummy gate layers using a reactive ion etch (RIE) process to form first and second dummy gate stacks having different sizes in a gate length direction, respectively, in a method of manufacturing a semiconductor device, according to an exemplary embodiment of the invention.

FIG. 9 is a cross-sectional view illustrating removal of exposed portions of the cap layer, and patterning of the first and second dummy gate layers using an RIE process to form first and second dummy gate stacks having different sizes in a gate length direction, respectively, in a method of manufacturing a semiconductor device, according to an exemplary embodiment of the invention. Referring to FIG. 9, an RIE process is performed that results in different lateral trimming between a-Si, which is the material of the first dummy gate layer 140, and a-SiGe, which is the material of the second dummy gate layer 160. For example, the RIE comprises chlorine-based chemistry. As can be understood from FIG. 9, the RIE process removes and laterally trims the a-SiGe of the second dummy gate layer 160 at a faster rate than the a-Si of the first dummy gate layer 140. In other words, given the RIE process, the a-SiGe of the second dummy gate layer 160 can be selectively etched with respect to the a-Si of the first dummy gate layer 140. As a result, the dummy gate layer 160 results in dummy gate stacks 165 on the dielectric layer 130 each having a smaller dimension in a gate length direction than the resulting dummy gate stacks 145 on the dielectric layer 130 from the dummy gate layer 140. The dimension in a gate length direction of a dummy gate stack 165 is shown as $L_1$ in FIG. 9, which is less than $L_{Nominal}$, the dimension in a gate length direction of a dummy stack 145. Accordingly, the a-Si gate stacks have greater sizes in a gate length direction than the a-SiGe gate stacks. Therefore, regions with different critical dimensions (CDs) (e.g., sizes in a gate length direction) can be achieved with the same RIE process.

The concentration of Ge in the a-SiGe can affect the rate at which the a-SiGe is removed and laterally trimmed during the RIE process. For example, a relatively higher concentration of Ge in the a-SiGe can result in faster lateral trimming than a-SiGe with a lower concentration of Ge, resulting in a smaller dimension in a gate length direction. Therefore, a resulting gate length in an end product can be controlled using the concentration of Ge in a-SiGe. In addition, the process is extendable to form more than two gate lengths in a resulting device by depositing, in addition to the dummy gate layers 140, 160, other dummy gate layers comprising a-SiGe with varying concentrations of Ge, so that two or more regions with different gate lengths can be achieved with the same RIE process. The resulting gate lengths can also be modified based on the doping of the a-SiGe. Further, the RIE chemistry, including, for example, etchants, etchant concentrations, temperatures and pressures can also cause different dimensions in a gate length direction. For example, hydroperoxide and chlorine ($Cl_2$) etches SiGe faster than Si.

As can be understood from FIGS. 8 and 9, the RIE process also removes exposed portions of the cap layer 170 not under the SIT spacers 180 to result in cap layer patterns 175, and reduces a vertical height of the SIT spacers 180.

Embodiments of the present invention are not necessarily limited to the use of a-Si and a-SiGe as the materials for the dummy gate layers 140, 160. Different materials can be used if the removal process of the dummy gate layers 140, 160 results in gate stacks (e.g., gate stacks 145, 165) having different dimensions in a gate length direction. Further, the removal process is not necessarily limited to SIT, and can include other processes, such as, for example, self-aligned double patterning (SADP), or extreme ultraviolet lithography (also known as EUV or EUVL).

Figure 10:
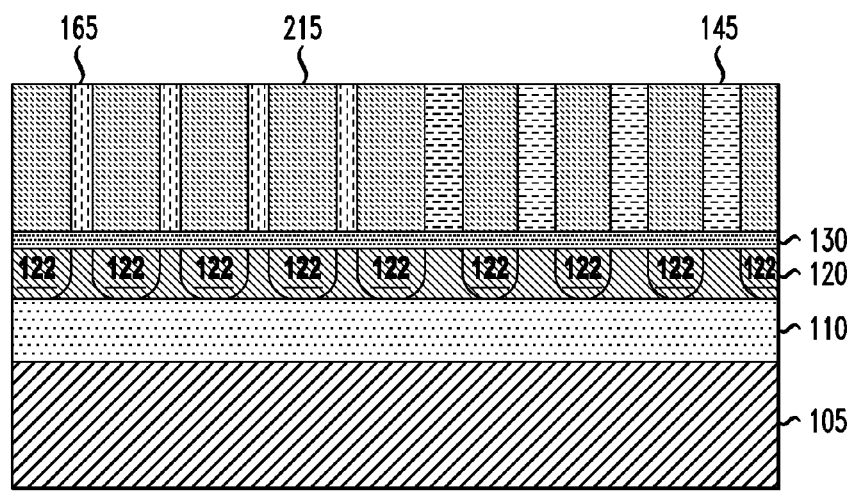
FIG. 10 is a cross-sectional view illustrating formation of formation of source/drain regions, a dielectric layer and removal of the SIT spacers and the cap layer, in a method of manufacturing a semiconductor device, according to an exemplary embodiment of the invention.

FIG. 10 is a cross-sectional view illustrating formation of source/drain regions, formation of a dielectric layer and removal of the SIT spacers and the cap layer, in a method of manufacturing a semiconductor device, according to an exemplary embodiment of the invention. Referring to FIG. 10, a layer of, for example, $SiO_2$, low-temperature oxide (LTO), high-temperature oxide (HTO), or field oxide (FOX) is formed on the structure in FIG. 9 using a deposition process, such as, for example, CVD, PECVD, PVD, ALD, MBD, PLD, and/or LSMCD. The deposited layer is planarized using a planarization process, such as, for example, CMP, to result in inter-layer dielectric (ILD) layer 215. As can be seen, the ILD layer is located on the dummy dielectric layer 130 and fills in regions around the gate stacks 145 and 165. According to an embodiment of the present invention, the remaining SIT spacers 180 and cap layer patterns 175 are removed during the planarization process. Alternatively, the remaining SIT spacers 180 and cap layer patterns 175 can be removed prior to deposition of the ILD layer, using for example, hydrofluoric acid to etch silicon oxide SIT spacers, and hot phosphoric acid can be used to etch a silicon nitride cap layer.

The source/drain (S/D) regions 122 are formed by incorporating dopants (such as, for example, boron, indium, phosphorus, arsenic, etc.) into the semiconductor layer 120 adjacent the gates. S/D formation may include, for example, ion implantation, plasma doping, epitaxial growth, thermal anneal, or any suitable combination of those techniques. The source/drain regions may further include raised source/drain regions (not shown) by epitaxially growing a semiconductor layer in a source/drain region. The epitaxy process may be in-situ doped (incorporating dopants during epitaxy). Spacers (not shown) can be formed on the dummy gate sidewalls before or after formation of S/D regions.

Figure 11:
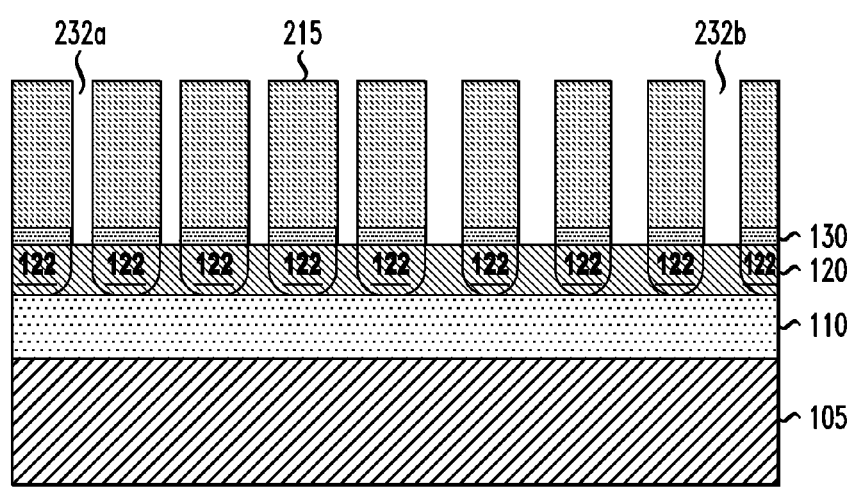
FIG. 11 is a cross-sectional view illustrating removal of the first and second dummy gate stacks and dummy dielectric, in a method of manufacturing a semiconductor device, according to an exemplary embodiment of the invention.

FIG. 11 is a cross-sectional view illustrating removal of the first and second dummy gate stacks and dummy dielectric, in a method of manufacturing a semiconductor device, according to an exemplary embodiment of the invention. Referring to FIG. 11, the first and second dummy gate stacks 145, 165 and portions of the dummy dielectric 130 under the dummy gate stacks 145, 165 are removed by any suitable etching process or combination of etching processes capable of selectively removing the dummy gate stacks 145, 165 and the portions of the dummy dielectric 130 without substantially removing the ILD layer 215 to form different sized gate cavities 232a and 232b, where the respective sizes of cavities 232a and 232b correspond to the different dimensions in a gate length direction of gate stacks 145 and 165.

The first and second dummy gate stacks 145, 165 and portions of the dummy dielectric 130 may be removed by, for example, an RIE process, which can selectively remove the gate stacks 145, 165, and, for example, a hydrofluoric acid-containing wet etch to remove the exposed portion of the dummy dielectric layer 130.

Figure 12:
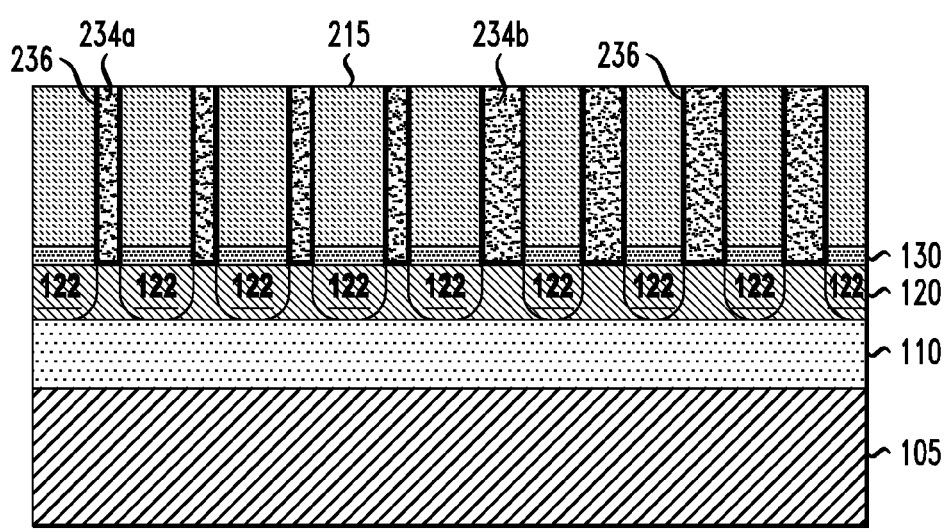
FIG. 12 is a cross-sectional view illustrating formation of a replacement dielectric layers and metal gates, in a method of manufacturing a semiconductor device, according to an exemplary embodiment of the invention.

FIG. 12 is a cross-sectional view illustrating formation of a replacement dielectric layers and metal gates, in a method of manufacturing a semiconductor device, according to an exemplary embodiment of the invention. In accordance with a replacement metal gate (RMG) flow, a dielectric layer 236, for example, a high-K dielectric layer is deposited to line sides and a bottom of cavities 232a and 232b. The dielectric layer 236 can include, but is not limited to silicon oxide, hafnium oxide, zirconium oxide, aluminum oxide, titanium oxide, lanthanum oxide, strontium titanium oxide, lanthanum aluminum oxide, and mixtures thereof. Replacement metal gate electrodes 234a and 234b having different gate lengths are formed, wherein replacement metal gate electrode 234b has a larger gate length than that of replacement metal gate electrode 234a. As can be understood, the gate lengths of replacement metal gate electrodes 234a and 234b respectively correspond to those of gate stacks 165 and 145. Replacement metal gate electrodes 234a and 234b may be formed using, for example, deposition techniques such as, for example, CVD, PECVD, PVD, ALD, MBD, PLD, and/or liquid LSMCD, sputtering, and/or plating. The replacement metal gate electrodes 234a and 234b may include gate conductor materials including, but not limited to, zirconium, tungsten, tantalum, hafnium, titanium, aluminum, ruthenium, metal carbides, metal nitrides, transition metal aluminides, tantalum carbide, titanium carbide, tantalum magnesium carbide, or combinations thereof. While not shown, known methods are used to form source/drain and channel regions for transistors including the replacement metal gate electrodes 234a and 234b.

Figure 13A:
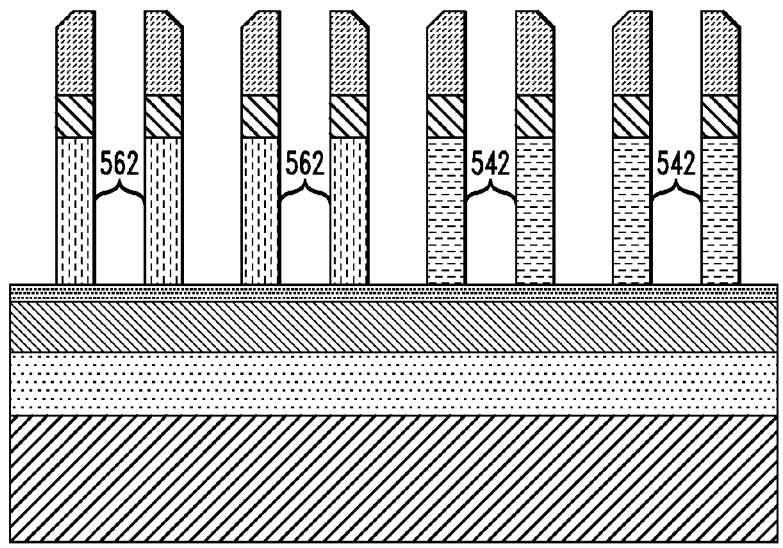
FIG. 13A is a cross-sectional view illustrating removal of exposed portions of a cap layer, and patterning of first and second dummy gate layers using an RIE process to form first and second dummy gate stacks having the same sizes in a gate length direction, in a method of manufacturing a semiconductor device, according to an exemplary embodiment of the invention.

FIG. 13A is a cross-sectional view illustrating removal of exposed portions of a cap layer, and patterning of first and second dummy gate layers using an RIE process to form first and second dummy gate stacks having the same dimensions in a gate length direction, in a method of manufacturing a semiconductor device, according to an exemplary embodiment of the invention. Following from FIG. 8, FIG. 13A illustrates the results of an RIE process that is performed to remove portions of dummy gate layers 140 and 160 and exposed portions of the cap layer 170 not under the SIT spacers 180. However, unlike what is shown in FIG. 9, the RIE process used to result in the configuration in FIG. 13A does not distinguish a-Si and a-SiGe, and therefore, results in the same-L gate stacks 542 and 562. A subsequent step, wherein a-SiGe gate stacks 562 are laterally trimmed selective to the a-Si gate stacks 542, is performed to result in the configuration shown in FIG. 13B.

Figure 13B:
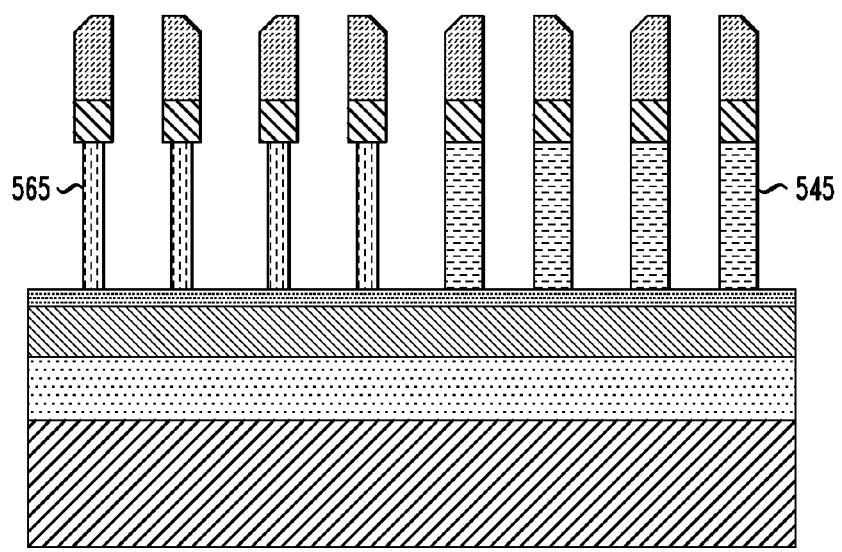
FIG. 13B is a cross-sectional view illustrating selective lateral trimming of the second dummy gate stacks to form first and second dummy gate stacks having different sizes in a gate length direction, respectively, in a method of manufacturing a semiconductor device, according to an exemplary embodiment of the invention.

FIG. 13B is a cross-sectional view illustrating selective lateral trimming of the second dummy gate stacks 562 to form first and second dummy gate stacks 545, 565 having different dimensions in a gate length direction, respectively, in a method of manufacturing a semiconductor device, according to an exemplary embodiment of the invention. Referring to FIG. 13B, the a-SiGe gate stacks 562 are trimmed selective to the a-Si gate stacks 542 to result in first and second dummy gate stacks 545, 565 having different dimensions in a gate length direction from each other. For example, and $H_2O_2$ etch can be used to perform the selective trimming to cause the second dummy gate stacks 565 to have a shorter dimension in a gate length direction than that of the first dummy gate stacks 545.

Figure 14:
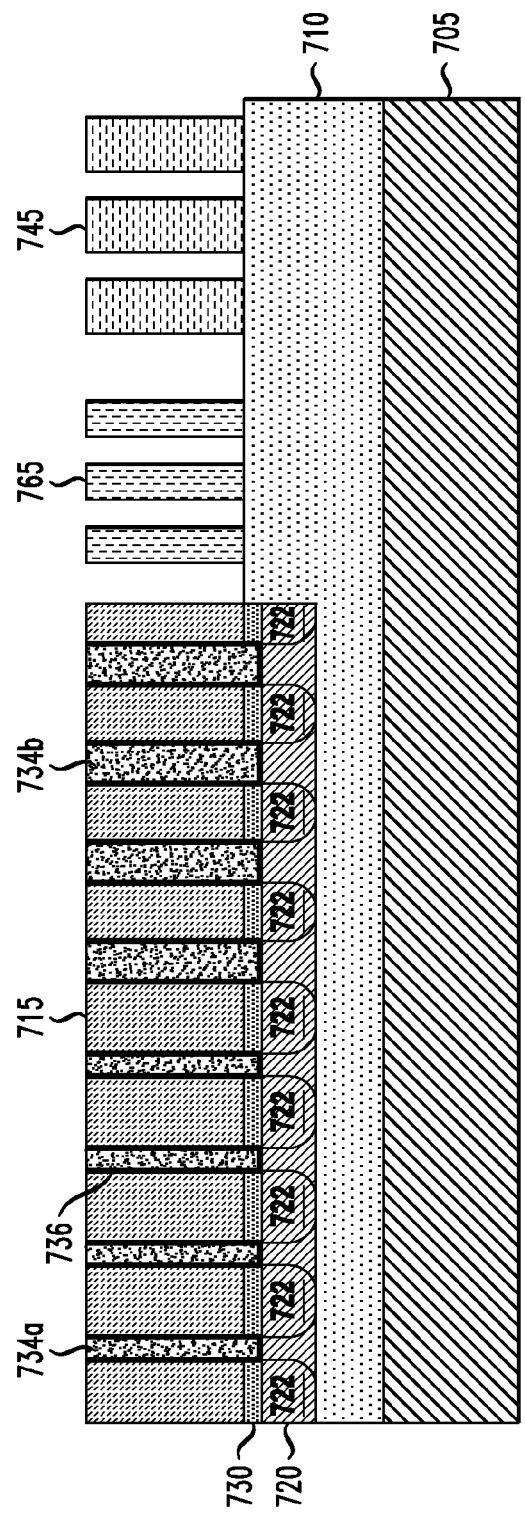
FIG. 14 is a cross-sectional view illustrating multiple length metal gates and multiple length resistors on the same chip formed in accordance with an exemplary embodiment of the invention.

FIG. 14 is a cross-sectional view illustrating multiple length metal gates and multiple length resistors on the same chip formed in accordance with an exemplary embodiment of the invention. FIG. 14 illustrates that instead of resulting in only gate electrodes of varying critical dimensions, the embodiments of the invention can also be used to form first and second resistors 745, 765 having different resistivities based on their different critical dimensions. On a portion of the same chip, based on the same or similar processing of the gate stacks 145 and 165, instead of proceeding with an RMG process, a-Si and a-SiGe stacks 745 and 765 are formed on an isolation region 710 of a substrate 705 to result in Si and SiGe resistors 745 and 765 having different resistivities. In some embodiments, the a-Si and a-SiGe can be doped with dopants such as boron, phosphorus, arsenic, etc. The dopant concentration ranges from $1e18/cm^3$ to $1e21/cm^3$. Referring to FIG. 14, in accordance with an embodiment, these a-Si and a-SiGe resistors 745 and 765 can be formed on the same chip as gate electrodes 734a and 734b having varying gate lengths and formed in accordance with the processes described hereinabove. As a result, as shown in FIG. 14, an integrated circuit can be formed, which comprises at least two different transistors with different gate lengths from each other, and silicon and silicon germanium resistors having different resistivities from each other.

Similar to what is shown in FIG. 12, the chip includes a dielectric layer 730 and S/D regions 722. Similar reference numbers to those used previously denote the same or similar features, elements, or structures, and a detailed explanation of the same or similar features, elements, or structures has not been repeated.

Although illustrative embodiments of the present invention have been described herein with reference to the accompanying drawings, it is to be understood that the invention is not limited to those precise embodiments, and that various other changes and modifications may be made by one skilled in the art without departing from the scope or spirit of the invention.

We claim:

1. A method for manufacturing a semiconductor device, comprising:

forming a first dummy gate layer on a substrate;
   forming a second dummy gate layer on the substrate adjacent the first dummy gate layer, wherein the second dummy gate layer comprises a material which is capable of being selectively etched with respect a material of the first dummy gate layer;
   patterning each of the first and second dummy gate layers into a plurality of first dummy gate stacks and a plurality of second dummy gate stacks, respectively, wherein the first dummy gate stacks are each wider along a gate length direction than each of the second dummy gate stacks; and
   replacing the first dummy gate stacks and the second dummy gate stacks with metal to form a plurality of first gate electrodes and a plurality of second gate electrodes respectively corresponding to the first dummy gate stacks and the second dummy gate stacks, wherein the first gate electrodes each have a larger gate length than a gate length of each of the second gate electrodes;
   wherein patterning each of the first and second dummy gate layers into respective first dummy gate stacks and second dummy gate stacks is performed using a reactive ion etch (RIE) process; and
   wherein the RIE process results in different lateral trimming between the first and second dummy gate layers.

2. The method of claim 1, wherein the first dummy gate layer comprises amorphous silicon (a-Si) and the second dummy gate layer comprises amorphous silicon germanium (a-SiGe).

3. The method of claim 1, further comprising forming a dielectric on the substrate between adjacent first dummy gate stacks, adjacent second dummy gate stacks, and adjacent first and second dummy gate stacks.

4. A method for manufacturing a semiconductor device, comprising:

forming a first dummy gate layer on a substrate;
   forming a second dummy gate layer on the substrate adjacent the first dummy gate layer, wherein the second dummy gate layer comprises a material which is capable of being selectively etched with respect a material of the first dummy gate layer;
   patterning each of the first and second dummy gate layers into a plurality of first dummy gate stacks and a plurality of second dummy gate stacks, respectively, wherein the first dummy gate stacks are each wider along a gate length direction than each of the second dummy gate stacks; and
   replacing the first dummy gate stacks and the second dummy gate stacks with metal to form a plurality of first gate electrodes and a plurality of second gate electrodes respectively corresponding to the first dummy gate stacks and the second dummy gate stacks, wherein the first gate electrodes each have a larger gate length than a gate length of each of the second gate electrodes;
   wherein forming the first dummy gate layer on the substrate comprises:
   depositing the first dummy gate layer on the substrate;
   covering a portion of the first dummy gate layer;
   removing an exposed portion of the first dummy gate layer from the substrate;
   wherein the second dummy gate layer is formed on the substrate in place of the removed portion of the first dummy gate layer.

5. A method for manufacturing a semiconductor device, comprising:

forming a first dummy gate layer on a substrate;
   forming a second dummy gate layer on the substrate adjacent the first dummy gate layer, wherein the second dummy gate layer comprises a material which is capable of being selectively etched with respect a material of the first dummy gate layer;
   patterning each of the first and second dummy gate layers into a plurality of first dummy gate stacks and a plurality of second dummy gate stacks, respectively, wherein the first dummy gate stacks are each wider along a gate length direction than each of the second dummy gate stacks;
   replacing the first dummy gate stacks and the second dummy gate stacks with metal to form a plurality of first gate electrodes and a plurality of second gate electrodes respectively corresponding to the first dummy gate stacks and the second dummy gate stacks, wherein the first gate electrodes each have a larger gate length than a gate length of each of the second gate electrodes;

forming a cap layer on the first and second dummy gate layers; and forming a plurality of sidewall image transfer (SIT) spacers on the cap layer.

6. The method of claim 5, further comprising forming a plurality of mandrels between respective pairs of the SIT spacers.

7. The method of claim 5, wherein the patterning each of the first and second dummy gate layers comprises:

etching exposed portions of the cap layer;

etching exposed portions of the first and second dummy gate layers in a direction toward an upper surface of the substrate; and selectively laterally trimming remaining portions of the second dummy gate layer under first SIT spacers of the plurality SIT spacers with respect to remaining portions of the first dummy gate layer under second SIT spacers of the plurality of SIT spacers.

8. The method of claim 7, wherein the etching and the selective lateral trimming are performed during the same reactive ion etch (RIE) process.

9. The method of claim 7, wherein the etching and the selective lateral trimming are performed during different etch processes.

10. A method for manufacturing a semiconductor device, comprising:

forming a first dummy gate layer on a substrate;

forming a second dummy gate layer on the substrate adjacent the first dummy gate layer, wherein the second dummy gate layer comprises a material which is capable of being selectively etched with respect a material of the first dummy gate layer; and patterning each of the first and second dummy gate layers into a plurality of first dummy gate stacks and a plurality of second dummy gate stacks, respectively, wherein the first dummy gate stacks are each wider along a gate length direction than each of the second dummy gate stacks;

wherein the patterning is performed using a reactive ion etch (RIE) process that results in different lateral trimming between the first and second dummy gate layers; and wherein the first dummy gate layer comprises amorphous silicon (a-Si) and the second dummy gate layer comprises amorphous silicon germanium (a-SiGe).

11. The method of claim 10, further comprising replacing the first dummy gate stacks and the second dummy gate stacks with metal to form a plurality of first gate electrodes and a plurality of second gate electrodes respectively corresponding to the first dummy gate stacks and the second dummy gate stacks, wherein the first gate electrodes each have a larger gate length than a gate length of each of the second gate electrodes.

12. The method of claim 10, further comprising using at least some of the first dummy gate stacks and at least some of the second dummy gate stacks as respective first and second resistors, wherein the first and second resistors have different resistivities from each other.

13. The method of claim 10, wherein forming the first dummy gate layer on the substrate comprises:

depositing the first dummy gate layer on the substrate;

covering a portion of the first dummy gate layer;

removing an exposed portion of the first dummy gate layer from the substrate;

wherein the second dummy gate layer is formed on the substrate in place of the removed portion of the first dummy gate layer.

14. The method of claim 10, further comprising:

forming a cap layer on the first and second dummy gate layers; and forming a plurality of sidewall image transfer (SIT) spacers on the cap layer.

15. The method of claim 14, wherein the patterning of each of the first and second dummy gate layers comprises:

etching exposed portions of the cap layer;

etching exposed portions of the first and second dummy gate layers in a direction toward an upper surface of the substrate; and selectively laterally trimming remaining portions of the second dummy gate layer under first SIT spacers of the plurality SIT spacers with respect to remaining portions of the first dummy gate layer under second SIT spacers of the plurality of SIT spacers.

16. The method of claim 10, further comprising forming a dielectric on the substrate between adjacent first dummy gate stacks, adjacent second dummy gate stacks, and adjacent first and second dummy gate stacks.

* * * * *